United States Patent
Le Sage et al.

(10) Patent No.: US 9,393,902 B2
(45) Date of Patent: Jul. 19, 2016

(54) TRANSPARENT ILLUMINATED DISPLAY SYSTEM FOR AUTOMOBILES

(71) Applicants: Hendrikus A. Le Sage, Sprang-Capelle (NL); Vincent A. A. Le Sage, Sprang-Capelle (NL)

(72) Inventors: Hendrikus A. Le Sage, Sprang-Capelle (NL); Vincent A. A. Le Sage, Sprang-Capelle (NL)

( * ) Notice: Subject to any disclaimer, the term of this patent is extended or adjusted under 35 U.S.C. 154(b) by 113 days.

(21) Appl. No.: 14/530,384

(22) Filed: Oct. 31, 2014

(65) Prior Publication Data

US 2015/0116977 A1    Apr. 30, 2015

Related U.S. Application Data

(60) Provisional application No. 61/898,091, filed on Oct. 31, 2013.

(51) Int. Cl.
*B60Q 1/50*     (2006.01)
*H05K 1/18*     (2006.01)
*G09F 9/30*     (2006.01)
*G09F 9/33*     (2006.01)
*G09F 21/04*    (2006.01)
*G09F 9/302*    (2006.01)
*H05K 1/02*     (2006.01)

(52) U.S. Cl.
CPC ............. *B60Q 1/503* (2013.01); *G09F 9/301* (2013.01); *G09F 9/3023* (2013.01); *G09F 9/33* (2013.01); *G09F 21/048* (2013.01); *H05K 1/189* (2013.01); *H05K 1/0274* (2013.01); *H05K 2201/0108* (2013.01); *H05K 2201/10106* (2013.01)

(58) Field of Classification Search
CPC ....... B60Q 1/503; G09F 9/301; G09F 9/3023; G09F 9/33; G09F 21/048; H05K 1/189
See application file for complete search history.

(56) References Cited

U.S. PATENT DOCUMENTS

2009/0085729 A1\* 4/2009 Nakamura ........... B60Q 1/2665
                                                   340/425.5
2012/0056738 A1\* 3/2012 Lynam .................. B60R 1/1207
                                                   340/468

\* cited by examiner

*Primary Examiner* — Mary Ellen Bowman
(74) *Attorney, Agent, or Firm* — Law Office of Mark Brown, LLC; Christopher M. DeBacker; Mark E. Brown

(57) ABSTRACT

A transparent illuminated display system, typically for use in automobile race events, including a highly flexible and transparent PCB board with ultra-low profile LED's mounted to it. The flexible and transparent PCB boards can be in the shape of a single or multiple numeric or alphanumeric displays. The face of the display which would make contact with the face of a wind screen would include an adhesive element. The transparent illuminated display is mounted to a vehicle as a kind of sticker on the inside or outside of a racecar windscreen, back window and/or side windows. Each of the displays could be wired to power and data lines and illuminate the required numbers or text to show the position and other info of the car in the race.

13 Claims, 5 Drawing Sheets

TRANSPARENT ILLUMINATED DISPLAY SYSTEM FOR AUTOMOBILES

CROSS-REFERENCE TO RELATED APPLICATION

This application claims priority in U.S. provisional patent application Ser. No. 61/898,091, filed Oct. 31, 2013, which is incorporated herein by reference.

BACKGROUND OF THE INVENTION

1. Field of the Invention

The present invention relates generally to an illuminated display system, and more particularly to an illuminated display system installed into the windshield of an automobile, such as a car meant for racing, which provides information to third parties.

2. Description of the Related Art

In auto racing there are numbers placed on the sides of cars to identify racers. More recently, numbers and other information has been placed on the front windscreen to show the cars starting/participant number to the officials, marshals and spectators.

These stickers can be any size and any letter type/font, and field experience shows that the race car driver does not have a problem with these single digit numbers blocking their view. However, these stickers are static in appearance and would have to be removed and replaced manually to be updated. What is needed is a simpler, more effective way to present this information which can be updated quickly and cheaply.

Heretofore there has not been available a system or method for providing a transparent illuminated display for automobiles with the advantages and features of the present invention.

SUMMARY OF THE INVENTION

The present invention generally provides a highly flexible and transparent printed circuit board (PCB) with ultra low profile light emitting diodes (LEDs) mounted to it. The flexible and transparent PCB boards can be in the shape of a single or multiple numeric or alphanumeric displays. The face of the display which would make contact with the face of a windscreen would include an adhesive element. Alternatively, suction cups or other semi-permanent mounting devices could be used.

The main purpose is to mount the transparent illuminated display as a kind of sticker on the inside or outside of a racecar windscreen, back window and/or side windows. Each of the displays could be wired to power and data lines and illuminate the required numbers or text to show the position and other info of the car in the race.

The transparent illuminated display can consist of any combination of letters and numbers. It is therefore possible to show any relevant number or text on each of a number of such display screens. The LEDs must be kept at a low enough light level such that they do not shine and blind the driver during day or night driving.

When the present invention is mounted on the outside of the windscreen its design allows the usage of normal windscreen wipers.

Any car windscreen is mounted differently and almost none of the windscreens are mounted vertically therefore the present invention has a provision that its LED's central beam of light can focus in a chosen direction, depending on the position of the sticker on the windscreen to make it better visible to any person, video camera or photo camera standing next to the track or on grandstands in front line of the approaching car.

BRIEF DESCRIPTION OF THE DRAWINGS

The drawings constitute a part of this specification and include exemplary embodiments of the present invention illustrating various objects and features thereof

DETAILED DESCRIPTION OF THE PREFERRED EMBODIMENTS

1. Introduction and Environment

As required, detailed aspects of the present invention are disclosed herein, however, it is to be understood that the disclosed aspects are merely exemplary of the invention, which may be embodied in various forms. Therefore, specific structural and functional details disclosed herein are not to be interpreted as limiting, but merely as a basis for the claims and as a representative basis for teaching one skilled in the art how to variously employ the present invention in virtually any appropriately detailed structure.

Certain terminology will be used in the following description for convenience in reference only and will not be limiting. For example, up, down, front, back, right and left refer to the invention as orientated in the view being referred to. The words, "inwardly" and "outwardly" refer to directions toward and away from, respectively, the geometric center of the aspect being described and designated parts thereof Forwardly and rearwardly are generally in reference to the direction of travel, if appropriate. Other terminology relating to a display device or user interface will be commonly referred to throughout the following description. The type of device, computer, display, or user interface may vary when practicing an embodiment of the present invention. Said terminology will include the words specifically mentioned, derivatives thereof and words of similar meaning.

II. Preferred Embodiment Display System 2

The present invention provides a highly modifiable means for providing information to outside parties during a car race by installing a number of alphanumeric LED displays onto automobiles. These displays light up, providing increased visibility to viewers. These displays can also be changed on the fly, thereby providing unique utility over the existing methods employed in the race car industry.

Figure 1:
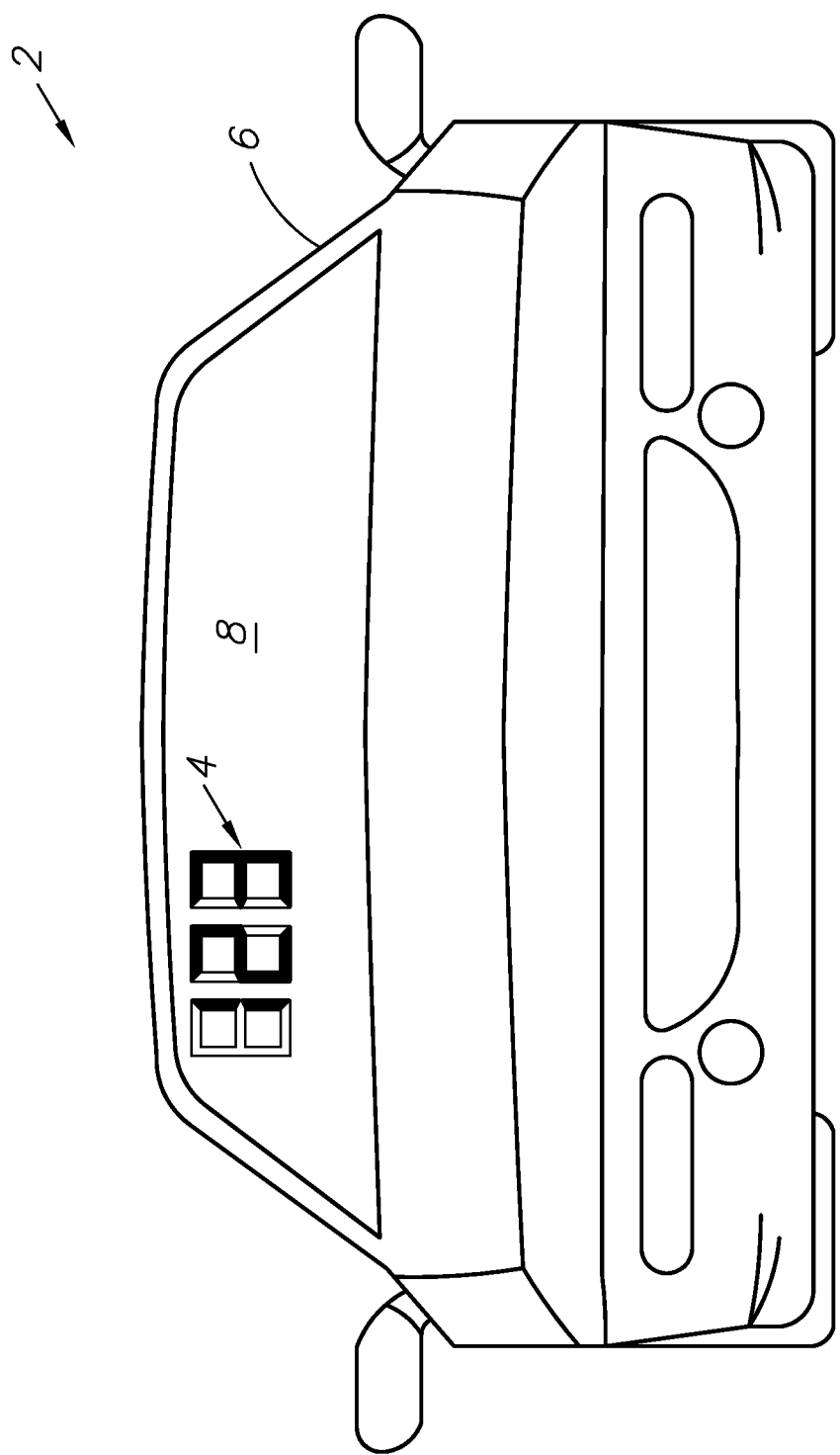
FIG. 1 is a front elevational view of a vehicle including an embodiment of the present invention.

FIG. 1 shows an embodiment of the present invention installed on the front windscreen 8 of an automobile 6. This could be accomplished using an adhesive 14 applied directly to the transparent display 4 comprising a transparent PCB 10 with mounted surface mount device (SMD) LED elements 12 or functionally equivalent lighting elements. A preferred embodiment includes ultra-low profile, high brightness SMD LED elements. The adhesive 14 could alternatively be replaced with suction cups or any other conceivable semi-permanent mounting method. A preferred embodiment includes a self-adhesive transparent layer.

As shown in FIG. 1, the transparent display 4 is mounted to the windshield or windscreen 8 of the vehicle and is used to display numbers, text, or other information. This display 4 may alternatively be mounted to any other window or structure of the vehicle. In FIG. 1, it is shown facing outward to display information to persons outside of the vehicle, however it could be reversed and the information could be displayed inward to the driver or passenger of the vehicle.

Figure 2:
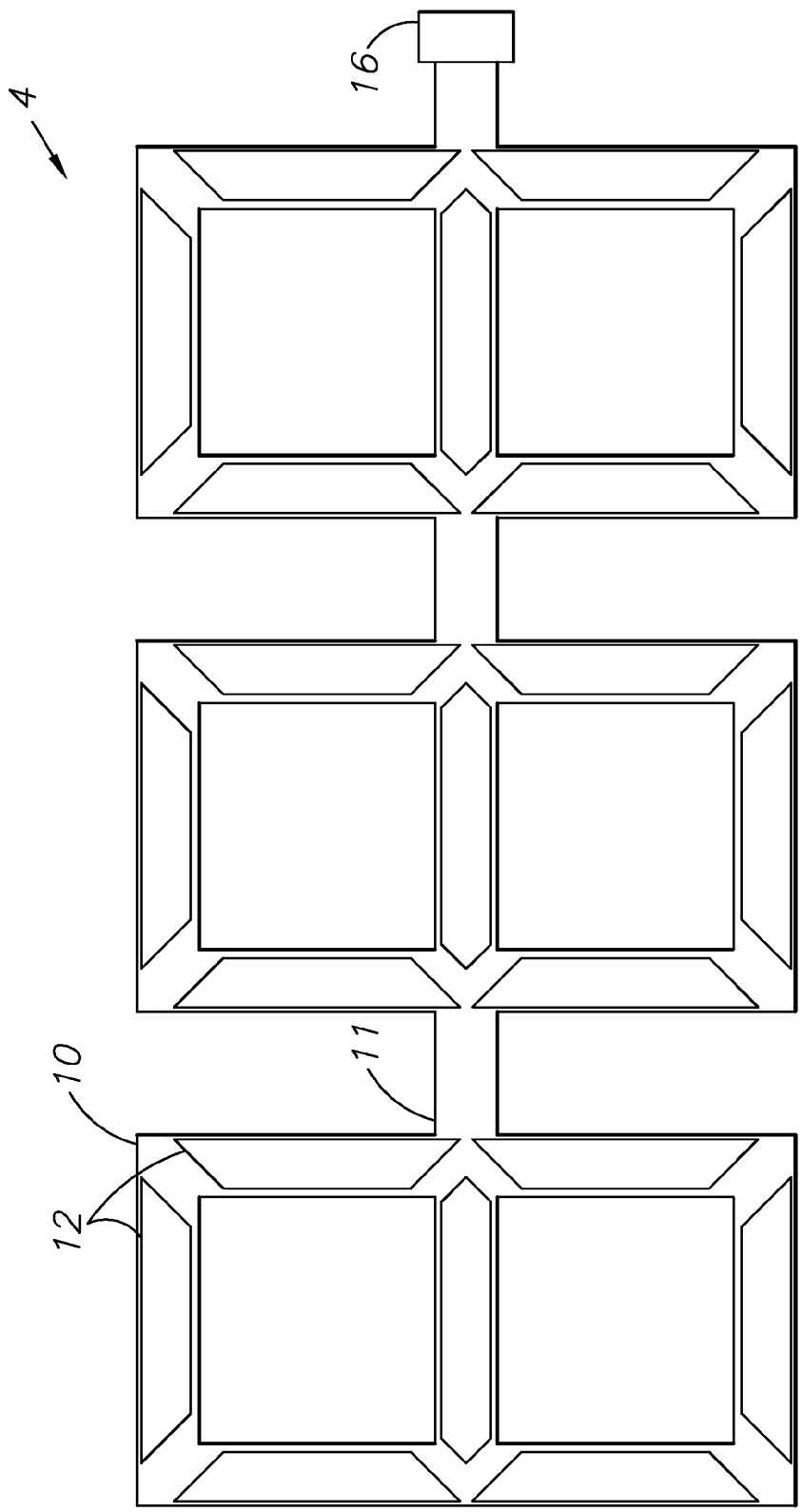
FIG. 2 is a front elevational view of an element of an embodiment of the present invention.

FIG. 2 shows an arrangement of at least three transparent PCB boards 10 mounted with LED elements 12 in such formation to display any Arabic numeral. The elements 12 could be of any size and shape and could also be placed in any formation, such as a formation capable of displaying any text or low resolution images. These PCB boards 10 and LED arrangements can come in any shape or size as desired. The displays are connected to power and data cables 11 and installed onto any window of a car. Multiple displays could be affixed to multiple windows, and each display would be updated simultaneously. A power connection port 16 is attached at one end of a series of PCB boards 10 and is connected to a power and communication line.

Figure 3A:
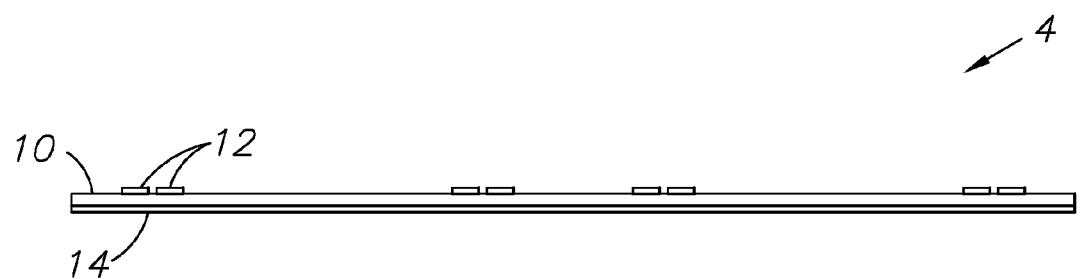
FIG. 3A is a top elevational view of an element of an embodiment of the present invention.
Figure 3B:
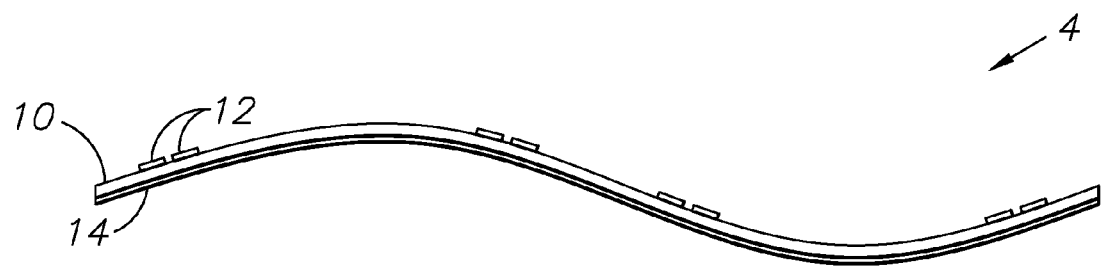
FIG. 3B is a top elevational view of an element of an embodiment of the present invention shown in an alternative arrangement.
Figure 3C:
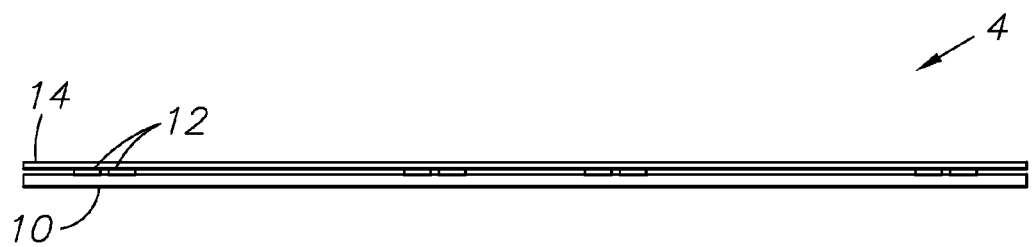
FIG. 3C is a top elevational view of an element of an embodiment of the present invention shown in yet another alternative arrangement.

FIGS. 3A-3C show multiple ways the transparent display 4 can be placed against a surface of a vehicle. FIG. 3A shows the display 4 with an adhesive layer 14 located on the back of the PCB boards 10. FIG. 3B shows the flexibility of the display 4, which allows the display to be placed on any surface, whether flat or curved. FIG. 3C alternatively shows the adhesive layer 14 placed in front of the LED elements 12, which allows the display to be placed on the inside surface of a window.

Figure 4:
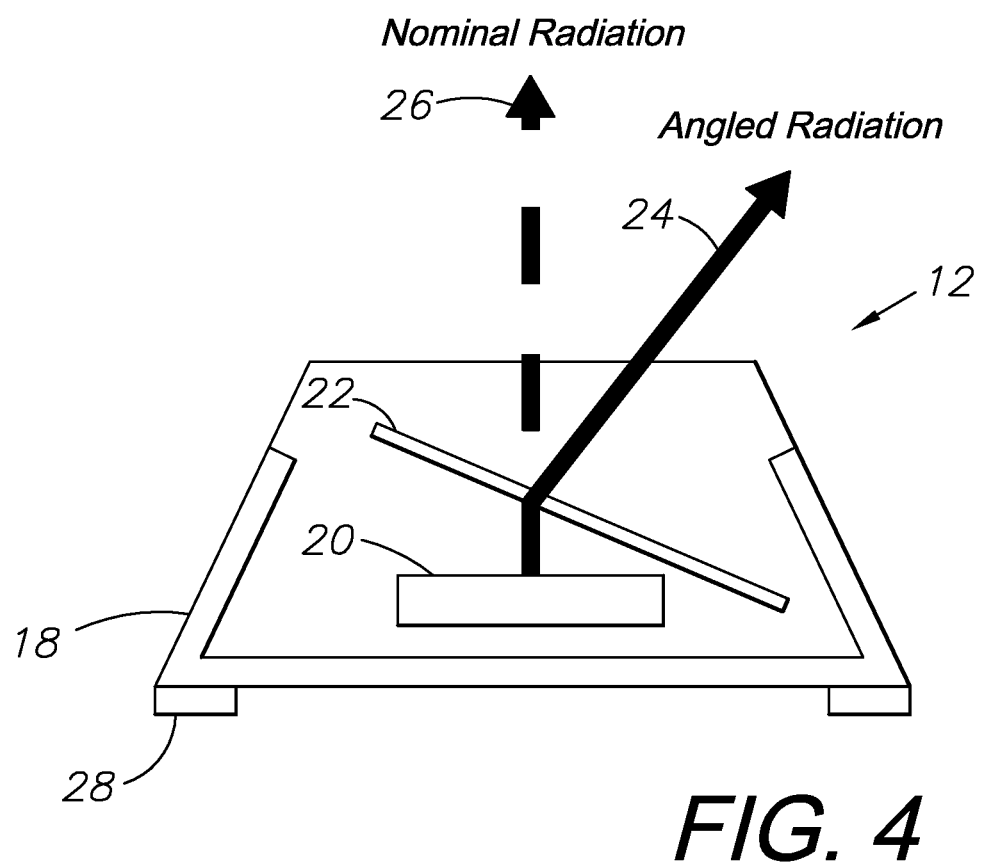
FIG. 4 is a diagrammatic detail view of an element encompassed in an embodiment of the present invention.

FIG. 4 indicates an LED element 12 having an angled radiation 24 using a one-way see through light mirror 22. This allows the display 4 to be aimed at an optimal direction towards viewers or camera crews, while protecting the driver from blindness caused by bright LED light sources 20. Only the nominal radiation 26 of light would be visible to the driver, which is drastically diminished from the angled radiation 24. The element 12 is encased in a housing 18 and is soldered to the PCB 10 with SMD solder electrodes 28.

III. Alternative Embodiment Display System 52

Figure 5A:
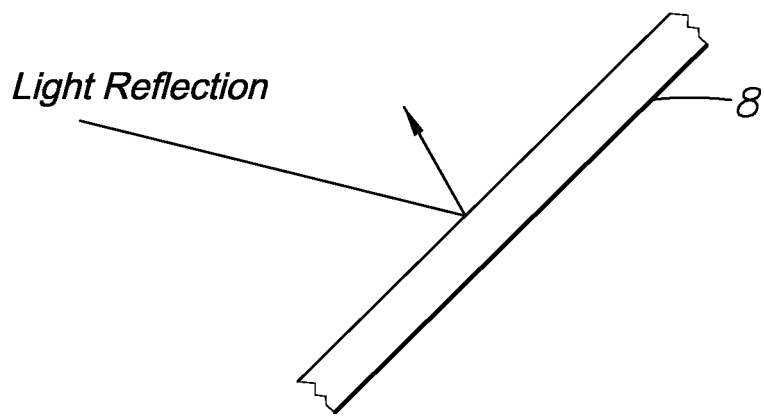
FIG. 5A is a diagrammatic sectional view of a standard vehicle wind screen with no additional features showing the effect of light reflecting from the screen
Figure 5B:
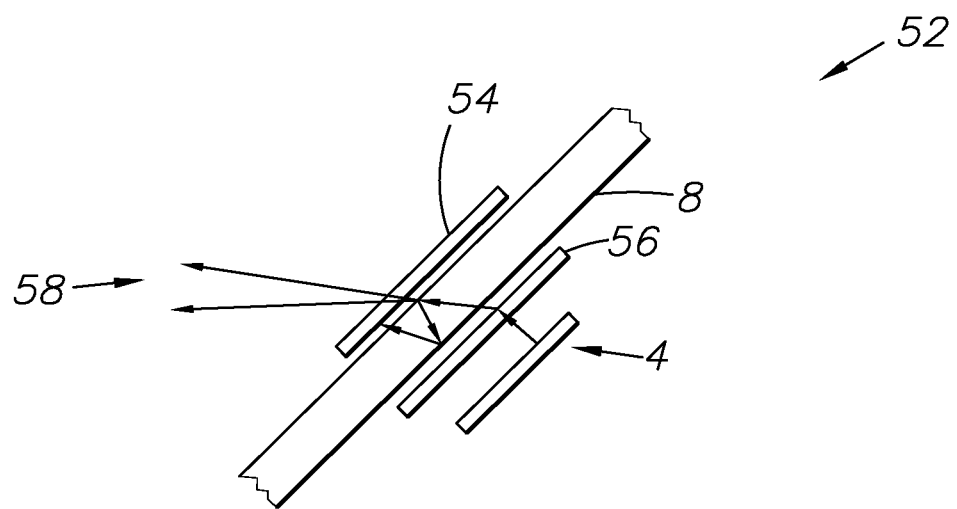
FIG. 5B is a diagrammatic sectional view of an alternative embodiment of the present invention with additional features for altering light at the surface of the vehicle wind screen.

FIG. 5A shows a standard vehicle windscreen 8 and how light reflects from the surface of the screen. FIG. 5B shows an alternative embodiment display system 52 including a transparent anti-reflection foil 54 applied to the exterior of the windscreen 8, which foil may include optional polarization for increased effectiveness. A transparent one way reflection foil 56 is similarly mounted inside of the windscreen 8 such that the two foils sandwich the windscreen between them. The display system 4 described in detail above is then placed behind the second foil 56.

These additional layers make it so that the transparent display 4 is better visible to video cameras for use during live or recorded broadcast. The first foil 54 is polished to reflect sunlight on the outside of the windscreen such that the LED elements 8 of the display 4 are better visible, while hiding the second foil 56, which is also transparent.

Typical polishing damages windscreens and would require permanent installation. However, the second foil 56 is applied to the inside of the windscreen which reduces reflections of the windscreen and is removable, preventing permanent damage to the windscreen. As noted above, each screen may also be polarized, resulting in a polarized light source 58 resulting from the display system 52.

It is to be understood that while certain embodiments and/or aspects of the invention have been shown and described, the invention is not limited thereto and encompasses various other embodiments and aspects.

Having thus described the invention, what is claimed as new and desired to be secured by Letters Patent is:

1. A display system for use with an automobile, the system comprising:
   a display including a semi-transparent printed circuit board (PCB) having a front face and a rear face, and a plurality of light emitting diode LED) elements communicatively affixed to said front face of said PCB;
   said display configured to be temporarily affixed to a surface of an automobile;
   a data cable connecting said display to a connection port configured to deliver power and communication signals to said PCB, wherein said communication signals activate at least one of said plurality of LED elements;
   each said LED element comprising a housing, an LED, a one way light mirror, and at least one surface mount device (SMD) solder electrode configured to connect said LED element to said PCB; and
   wherein said one way light mirror is angled within said LED element to a predetermined angle.

2. The display system of claim 1, further comprising an adhesive layer configured to temporarily affix said display to said automobile.

3. The display system of claim 2, wherein said adhesive layer is affixed to said rear face of said PCB.

4. The display system of claim 2, wherein said adhesive layer is affixed to said front face of said PCB and said plurality of LED elements.

5. The display system of claim 1, further comprising:
   wherein said semi-transparent PCB is a first semi-transparent PCB and wherein said data cable is a first data cable;
   a second semi-transparent printed circuit board (PCB) having a front face and a rear face, and a plurality of light emitting diode LED) elements; and
   a second data cable connecting said second semi-transparent PCB to said first semi-transparent PCB, said second data cable configured to deliver said power signals and said communication signals from said first PCB to said second PCB.

6. The display system of claim 5, wherein the plurality of LED elements of said first PCB and the plurality of LED elements of said second PCB are configured to display a unified message, wherein said message is comprised of at least two alphanumeric symbols.

7. The display system of claim 5, wherein the plurality of LED elements of said first PCB and the plurality of LED elements of said second PCB are configured to display a cloned message, wherein the message displayed on said first PCB is identical to the message displayed on said second PCB, and wherein said message comprises alphanumeric symbols.

8. The display system of claim 1, further comprising:
   a first transparent foil applied to the outer surface of said surface of said vehicle, wherein said surface is transparent and comprises inherent light reflective properties; and a second transparent foil applied to the inner surface of said surface of said vehicle such that the surface of said vehicle is sandwiched between the first and second transparent foils, and such that said second transparent foil is sandwiched between said surface of said vehicle and said display.

9. The display system of claim 8, wherein said surface of said vehicle is a vehicle windscreen.

10. The display system of claim 8, wherein said first transparent foil is an anti-reflection foil.

11. The display system of claim 10, wherein said first transparent foil is polarized.

12. The display system of claim 8, wherein said second transparent foil is a one-way reflection foil.

13. The display system of claim 12, wherein said second transparent foil is polarized.

* * * * *